US010778253B2

(12) United States Patent
Xiao et al.

(10) Patent No.: US 10,778,253 B2
(45) Date of Patent: Sep. 15, 2020

(54) DATA PROCESSING METHOD AND APPARATUS

(71) Applicant: Huawei Technologies Co., Ltd., Shenzhen (CN)

(72) Inventors: Zhiyu Xiao, Chengdu (CN); Ling Liu, Wuhan (CN); Liangchuan Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 167 days.

(21) Appl. No.: 15/965,250

(22) Filed: Apr. 27, 2018

(65) Prior Publication Data

US 2018/0248565 A1 Aug. 30, 2018

Related U.S. Application Data

(63) Continuation of application No. PCT/CN2015/093039, filed on Oct. 28, 2015.

(51) Int. Cl.
*H03M 13/39* (2006.01)
*H03M 13/25* (2006.01)
(Continued)

(52) U.S. Cl.
CPC .......... *H03M 13/17* (2013.01); *H03M 13/27* (2013.01); *H03M 13/2778* (2013.01); *H04L 1/005* (2013.01); *H04L 1/0071* (2013.01)

(58) Field of Classification Search
CPC ...... H04L 1/0071; H04L 1/005; H03M 13/17; H03M 13/2778; H03M 13/3746; H03M 13/27
See application file for complete search history.

(56) References Cited

U.S. PATENT DOCUMENTS 8,175,466 B2    5/2012   Djordjevic et al.
2003/0014700 A1*  1/2003  Giulietti ............ H03M 13/271
                                              714/701
(Continued)

FOREIGN PATENT DOCUMENTS

CN    101090306 A    12/2007
CN    101179356 A     5/2008
(Continued)

OTHER PUBLICATIONS

Yang, Jianxiao, "Iterative Decoding and Iterative Equalization Algorithms", Zhejiang University, Communication and Information System, Feb. 2008, 2 pages.
(Continued)

*Primary Examiner* — Guy J Lamarre
(74) *Attorney, Agent, or Firm* — Slater Matsil, LLP

(57) ABSTRACT

An embodiment method includes: performing balancing processing on a data stream that includes a plurality of sub-data stream segments, and performing segment de-interleaving on a data stream obtained after the balancing processing. The method further includes separately performing forward error correction (FEC) decoding on each sub-data stream segment in a data stream obtained after the segment de-interleaving. The method further includes performing, according to a balancing termination state of each sub-data stream segment obtained after previous balancing processing, balancing processing on each sub-data stream segment obtained after the FEC decoding, and performing FEC decoding on the data stream obtained after balancing processing is performed on each sub-data stream segment. When it is determined that a preset iteration termination condition is met, the method includes outputting the data stream obtained after the FEC decoding.

12 Claims, 8 Drawing Sheets

(51) Int. Cl.
- *H04L 1/00* (2006.01)
- *H04L 25/03* (2006.01)
- *H03M 13/41* (2006.01)
- *H03M 13/17* (2006.01)
- *H03M 13/27* (2006.01)

(56) References Cited

U.S. PATENT DOCUMENTS

| | | | |
|---|---|---|---|
| 2008/0104090 A1* | 5/2008 | Akelbein | G06F 11/1448 |
| 2008/0115031 A1 | 5/2008 | Shen | |
| 2009/0022237 A1 | 1/2009 | Wang et al. | |
| 2009/0177945 A1* | 7/2009 | Djordjevic | H03M 13/1102 714/758 |
| 2011/0044399 A1* | 2/2011 | Dowling | H04L 25/03286 375/286 |
| 2011/0116359 A1 | 5/2011 | Li et al. | |
| 2011/0231738 A1 | 9/2011 | Horisaki | |
| 2012/0099660 A1* | 4/2012 | Mun | H04L 29/00 375/240.27 |
| 2012/0153730 A1* | 6/2012 | Barnett | H02M 3/285 307/82 |
| 2014/0119458 A1* | 5/2014 | Limberg | H04N 19/89 375/240.27 |

FOREIGN PATENT DOCUMENTS

| | | |
|---|---|---|
| CN | 101350697 A | 1/2009 |
| CN | 101714971 A | 5/2010 |
| WO | 2009017814 A2 | 2/2009 |

OTHER PUBLICATIONS

Vargas, A., et al. "QoS-Oriented Solutions for Satellite Broadcasting Systems," Journal of Communications and Networkds, vol. 12, No. 6, Dec. 2010, pp. 558-567, XP11483498.

Yang, Y., et al. "Channel equalization in wideband single-carrier transmission using a filter bank transform and a block interleaved DFE," 2007 IEEE 8th Workshop on Signal Processing Advances in Wireless Communications, Jun. 17-20, 2007, 6 pages, XP31189492.

Pons, J., et al. "Self-Protection of Turbo- and LDPC-Coded OFDM Systems against Non-Stationary Disturbances," Sarnoff Symposium, Mar. 27-28, 2006, IEEE, 6 pages, XP31266810.

* cited by examiner

DATA PROCESSING METHOD AND APPARATUS

CROSS-REFERENCE TO RELATED APPLICATIONS

This application is a continuation of International Application No. PCT/CN2015/093039, filed on Oct. 28, 2015, which is hereby incorporated by reference in its entirety.

TECHNICAL FIELD

This application relates to the field of communications technologies, and in particular, to a data processing method and apparatus.

BACKGROUND

FEC (Forward Error Correction) is an error control manner. When data on which FEC coding is performed is decoded at a receive end, a bit error that occurs in a transmission process of the data may be found and corrected. Therefore, an FEC technology improves transmission reliability and has wide application in long-distance transmission. In addition, to further correct a bit error, an interleaving technology may further be used. The interleaving technology can disperse, to an utmost extent, centralized burst bit errors over a channel transmission process, so as to improve a bit error correction capability of the receive end. FIG. 1 is a schematic diagram of processing performed by a transmit end on a data stream according to the prior art. In FIG. 1, FEC coding is first performed on the data stream at the transmit end, then channel interleaving is performed on the data stream, and then the data stream is sent. FIG. 2 is a schematic diagram of processing performed by a receive end on a data stream according to the prior art. In FIG. 2, at the receive end, processing such as de-interleaving and FEC decoding is performed on the data stream on which channel balancing is performed, and finally decision is performed on the decoded data stream to obtain a data stream sent by a transmit end.

As a transmission rate in a transmission system increases, for example, a transmission rate that is initially 40 Gb/s is now 100 Gb/s and may even be up to 400 Gb/s in the future, a bit error amount of burst bit errors that occur when a data stream is being transmitted over a channel is increasingly large. If the method for processing a received data stream by a receive end in FIG. 2 is still used, only a small part of the burst bit errors can be corrected, and consequently a capability of the receive end on correctly correcting a bit error is degraded, and a system gain is reduced.

SUMMARY

Embodiments of this application provide a data processing method and apparatus, so as to improve a bit error correction capability of a receive end and increase a system gain.

According to a first aspect, a data processing method is provided. The method includes performing balancing processing on a data stream that includes a plurality of sub-data stream segments, and performing segment de-interleaving on a data stream obtained after the balancing processing. The method further includes separately performing forward error correction FEC decoding on each sub-data stream segment in a data stream obtained after the segment de-interleaving. The method further includes performing, according to a balancing termination state of each sub-data stream segment obtained after previous balancing processing, balancing processing on each sub-data stream segment obtained after the FEC decoding. The method further includes performing FEC decoding on the data stream obtained after balancing processing is performed on each sub-data stream segment. The method further includes if it is determined that a preset iteration termination condition is met, outputting the data stream obtained after the FEC decoding; or if it is determined that a preset iteration termination condition is not met, returning to a step of the performing, according to a balancing termination state of each sub-data stream segment obtained after previous balancing processing, balancing processing on each sub-data stream segment obtained after the FEC decoding.

With reference to the first aspect, in a first implementation of the first aspect, the performing balancing processing on a data stream that includes a plurality of sub-data stream segments, and performing segment de-interleaving on a data stream obtained after the balancing processing includes: determining a location of each sub-data stream segment in the data stream obtained after the balancing processing in a data stream obtained after the segment de-interleaving; and recombining each sub-data stream segment according to the location of each sub-data stream segment in the data stream obtained after the segment de-interleaving, and using a recombined data stream as the data stream obtained after the segment de-interleaving, where an order of data in each sub-data stream segment remains unchanged.

In the foregoing solution, burst bit errors can be dispersed while ensuring continuity of data in each sub-data stream segment, so that no interleaving or de-interleaving operation needs to be performed when FEC decoding and balancing are performed on each sub-data stream segment again, and complexity of the system is reduced.

With reference to the first aspect, in a second implementation of the first aspect, that it is determined that a preset iteration termination condition is met includes: if it is determined that a quantity of times for which FEC decoding is separately performed on each sub-data stream segment is equal to a threshold or that a quantity of times for which balancing processing is performed on each sub-data stream segment is equal to the threshold, determining that the preset iteration termination condition is met. Alternatively, if it is determined that a cyclic redundancy check CRC check performed on the data stream obtained after the FEC decoding succeeds, determining that the preset iteration termination condition is met.

With reference to the first aspect, in a third implementation of the first aspect, the performing, according to a balancing termination state of each sub-data stream segment obtained after previous balancing processing, balancing processing on each sub-data stream segment obtained after the FEC decoding includes: obtaining each sub-data stream segment obtained after the FEC decoding, and performing balancing processing on each sub-data stream segment according to an order of a location of each sub-data stream segment in the data stream obtained after the FEC decoding and the balancing termination state of each sub-data stream segment obtained after the previous balancing processing; or obtaining each sub-data stream segment obtained after the FEC decoding, performing parallel balancing processing according to the balancing termination state of each sub-data stream segment obtained after the previous balancing processing, recombining each sub-data stream segment obtained after the parallel balancing processing into a data stream according to a location of each sub-data stream segment in the data stream obtained before the parallel balancing processing, and outputting the data stream.

In the foregoing solution, parallel balancing processing may be performed on the plurality of sub-data stream segments to improve balancing processing efficiency.

According to a second aspect, a data processing method is provided. The method includes obtaining a data stream, and performing forward error correction FEC coding on the data stream. The method further includes obtaining, by segmenting a data stream obtained after the FEC coding, a data stream that includes a plurality of sub-data stream segments. The method further includes performing segment interleaving on the data stream that includes the plurality of sub-data stream segments, and sending a data stream obtained after the segment interleaving, where the segment interleaving includes re-sorting a location of each sub-data stream segment in the data stream that includes the plurality of sub-data stream segments, and an order of data in each sub-data stream segment in the data stream obtained after the segment interleaving remains unchanged.

With reference to the second aspect, in a first implementation of the second aspect, the performing segment interleaving on the data stream that includes the plurality of sub-data stream segments includes: determining a location of each sub-data stream segment in the data stream obtained after the segment interleaving; and recombining each sub-data stream segment according to the location of each sub-data stream segment in the data stream obtained after the segment interleaving, and using a recombined data stream as the data stream obtained after the segment interleaving.

In the foregoing solution, by means of segment interleaving, burst bit errors can be dispersed while ensuring continuity of data in each sub-data stream segment, so that no interleaving or de-interleaving operation needs to be performed when a receive end performs FEC decoding and balancing on each sub-data stream segment again, and complexity of the system is reduced.

According to a third aspect, a data processing apparatus is provided. The apparatus includes a de-interleaver, configured to perform balancing processing on a data stream that includes a plurality of sub-data stream segments, and perform segment de-interleaving on a data stream obtained after the balancing processing. The apparatus includes a decoder, configured to separately perform forward error correction FEC decoding on each sub-data stream segment in a data stream obtained after the segment de-interleaving. The apparatus includes a balancer, configured to perform, according to a balancing termination state of each sub-data stream segment obtained after previous balancing processing, balancing processing on each sub-data stream segment obtained after the FEC decoding; and perform, by using the decoder, FEC decoding on the data stream obtained after balancing processing is performed on each sub-data stream segment. The apparatus includes a processor, configured to: if it is determined that a preset iteration termination condition is met, output the data stream obtained after the FEC decoding; or if it is determined that a preset iteration termination condition is not met, return to a step of the performing, according to a balancing termination state of each sub-data stream segment obtained after previous balancing processing, balancing processing on each sub-data stream segment obtained after the FEC decoding.

With reference to the third aspect, in a first implementation of the third aspect, the de-interleaver is specifically configured to: determine a location of each sub-data stream segment in the data stream obtained after the balancing processing in a data stream obtained after the segment de-interleaving; and recombine each sub-data stream segment according to the location of each sub-data stream segment in the data stream obtained after the segment de-interleaving, and use a recombined data stream as the data stream obtained after the segment de-interleaving, where an order of data in each sub-data stream segment remains unchanged.

With reference to the third aspect, in a second implementation of the third aspect, the processor is specifically configured to: if it is determined that a quantity of times for which FEC decoding is separately performed on each sub-data stream segment is equal to a threshold or that a quantity of times for which balancing processing is performed on each sub-data stream segment is equal to the threshold, determine that the preset iteration termination condition is met. Alternatively, if it is determined that a cyclic redundancy check CRC check performed on the data stream obtained after the FEC decoding succeeds, determine that the preset iteration termination condition is met.

With reference to the third aspect, in a third implementation of the third aspect, the balancer is specifically configured to: obtain each sub-data stream segment obtained after the FEC decoding, and perform balancing processing on each sub-data stream segment according to an order of a location of each sub-data stream segment in the data stream obtained after the FEC decoding and the balancing termination state of each sub-data stream segment obtained after the previous balancing processing; or obtain each sub-data stream segment obtained after the FEC decoding, perform parallel balancing processing according to the balancing termination state of each sub-data stream segment obtained after the previous balancing processing, recombine each sub-data stream segment obtained after the parallel balancing processing into a data stream according to a location of each sub-data stream segment in the data stream obtained before the parallel balancing processing, and output the data stream.

According to a fourth aspect, a data processing apparatus is provided. The apparatus includes a transceiver, configured to obtain a data stream. The apparatus includes a coder, configured to perform forward error correction FEC coding on the data stream. The apparatus includes a processor, configured to obtain, by segmenting a data stream obtained after the FEC coding, a data stream that includes a plurality of sub-data stream segments. The apparatus includes an interleaver, configured to perform segment interleaving on the data stream that includes the plurality of sub-data stream segments, and send, by using the transceiver, a data stream obtained after the segment interleaving, where the segment interleaving includes re-sorting a location of each sub-data stream segment in the data stream that includes the plurality of sub-data stream segments, and an order of data in each sub-data stream segment in the data stream obtained after the segment interleaving remains unchanged.

With reference to the fourth aspect, in a first implementation of the fourth aspect, the interleaver is specifically configured to: determine a location of each sub-data stream segment in the data stream obtained after the segment interleaving; and recombine each sub-data stream segment according to the location of each sub-data stream segment in the data stream obtained after the segment interleaving, and use a recombined data stream as the data stream obtained after the segment interleaving.

According to the method and apparatus provided in the embodiments of this application, after balancing processing is performed on a received data stream, segment de-interleaving is performed on the data stream to obtain a data stream that includes a plurality of sub-data stream segments. In this case, burst bit errors occur in the received data stream, and consecutive burst bit errors are dispersed and distributed in a plurality of sub-data stream segments. After the burst bit errors are dispersed, iterative FEC decoding and balancing processing are separately performed on each sub-data stream segment, so that bit error correction is implemented, a bit error correction capability of a receive end is improved, and a system gain is increased. In addition, in the embodiments of this application, the burst bit errors are dispersed into a plurality of segments of consecutive bit errors by means of segment de-interleaving, and as a result, when iterative FEC decoding and balancing are subsequently performed on each sub-data stream segment separately, interleaving and de-interleaving do not need to be performed on the data stream again. Therefore, system complexity is reduced.

DETAILED DESCRIPTION OF ILLUSTRATIVE EMBODIMENTS

The following describes the embodiments of this application in detail with reference to accompanying drawings of this specification.

The embodiments of this application may be applied to a communications system in which data is transmitted by using a wired channel and a wireless channel. The wired channel may be an open wire, a symmetrical cable, a coaxial cable, and/or an optical fiber.

Figure 1:
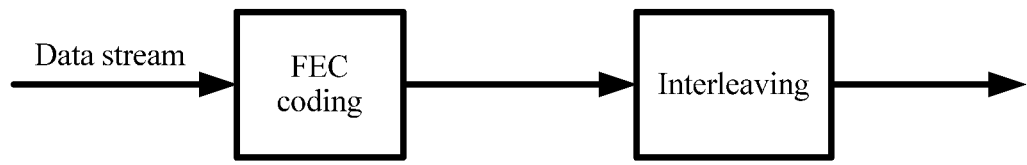
FIG. 1 is a schematic diagram of processing performed by a transmit end on a data stream according to the prior art.
Figure 2:
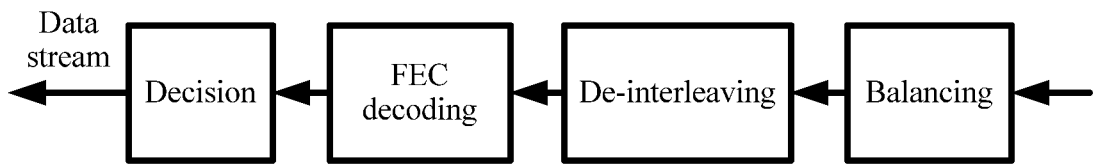
FIG. 2 is a schematic diagram of processing performed by a receive end on a data stream according to the prior art.
Figure 3:
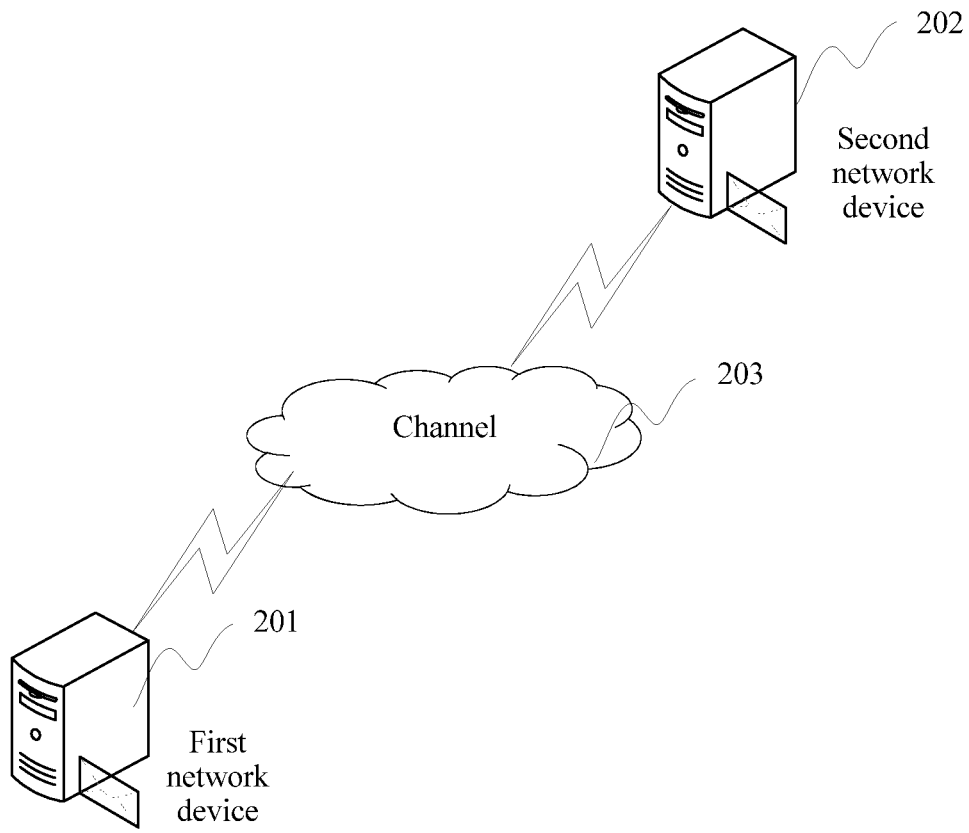
FIG. 3 is a schematic diagram of an architecture of a communications system according to an embodiment of this application.

FIG. 3 is a schematic diagram of an architecture of a communications system according to an embodiment of this application. In FIG. 3, a channel 203 between a first network device 201 and a second network device 202 may be a wired channel or a wireless channel. The first network device 201 and the second network device 202 may be a base station, a computer, a mobile phone, a tablet computer, a personal digital assistant (PDA), a mobile Internet device (MID), a wearable device, an Internet Protocol (IP) phone, an e-book reader, or the like.

If a transmit end is the first network device 201 in FIG. 3, a receive end may be the second network device 202 in FIG. 3; or if a transmit end is the second network device 202 in FIG. 3, a receive end may be the first network device 201 in FIG. 3. In this embodiment of this application, processing such as FEC coding and segment interleaving needs to be performed on a received data stream at the transmit end. The receive end needs to perform processing such as balancing processing, segment de-interleaving, FEC decoding, and segment balancing on a received data stream.

Figure 4:
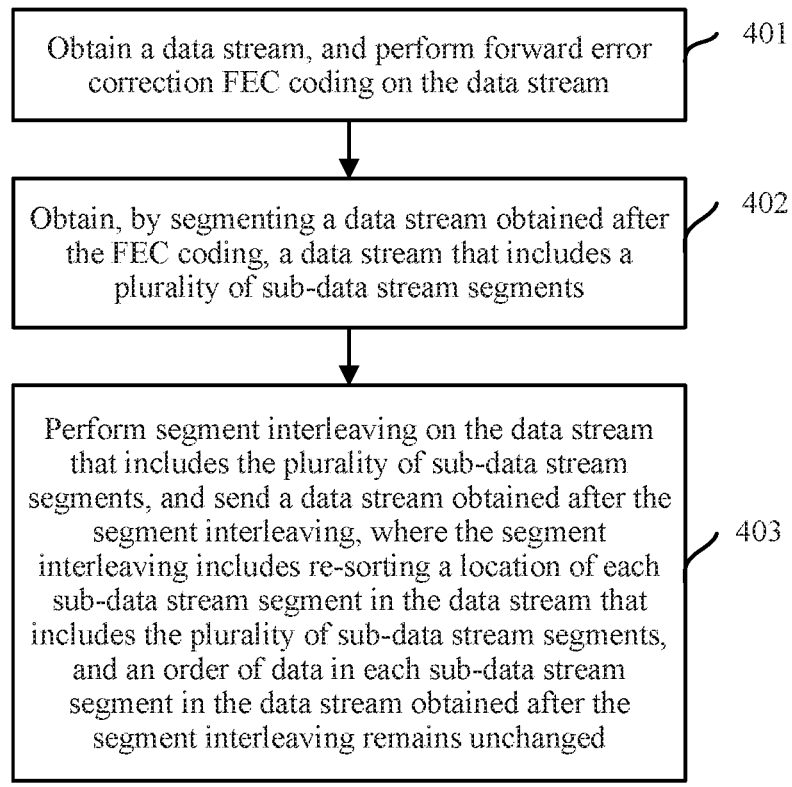
FIG. 4 is a schematic flowchart of a data processing method according to an embodiment of this application.

Specifically, FIG. 4 is a schematic flowchart of data processing according to an embodiment of this application.

Referring to FIG. 4, the method specifically includes the following steps:

Step 401: Obtain a data stream, and perform forward error correction FEC coding on the data stream.

Step 402: Obtain, by segmenting a data stream obtained after the FEC coding, a data stream that includes a plurality of sub-data stream segments.

Step 403: Perform segment interleaving on the data stream that includes the plurality of sub-data stream segments, and send a data stream obtained after the segment interleaving, where the segment interleaving includes re-sorting a location of each sub-data stream segment in the data stream that includes the plurality of sub-data stream segments, and an order of data in each sub-data stream segment in the data stream obtained after the segment interleaving remains unchanged.

In step 401, the transmit end performs FEC coding on an obtained to-be-sent data stream. A specific implementation of the FEC coding is not limited in this embodiment of this application. The FEC coding may be implemented by using an Low Density Parity Check (LDPC) code coding algorithm or a Turbo code coding algorithm. Alternatively, the FEC coding may be implemented in another manner, and details are not described herein.

In step 402, in this embodiment of this application, data of M bits in the data stream obtained after the FEC coding may be grouped as one sub-data stream segment, and M is a positive integer that is greater than 1.

Figure 5:
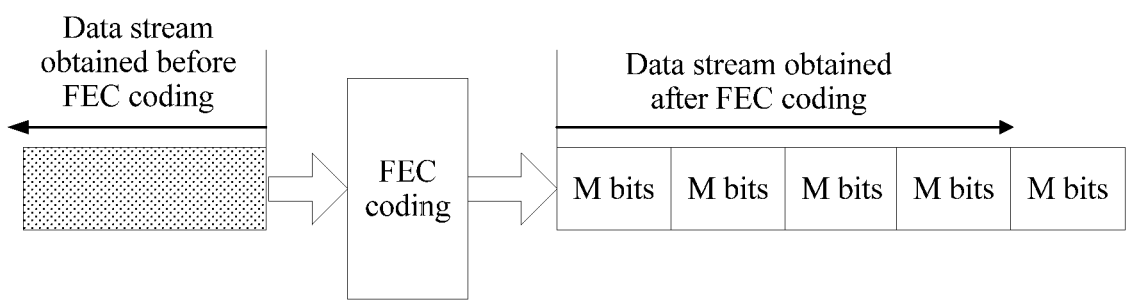
FIG. 5 is a schematic diagram of segmentation performed on a data stream obtained after FEC coding according to an embodiment of this application.

For example, FIG. 5 is a schematic diagram of segmentation performed on the data stream obtained after the FEC coding in an embodiment of this application.

Optionally, M may be 8, 16, 32, 64, or the like.

Optionally, a bit quantity of data included in each sub-data stream segment may be different.

In step 403, in this embodiment of this application, after performing FEC coding on the obtained data stream, the transmit end performs segment interleaving. Specifically, the segment interleaving is to re-sort, according to a preset segment interleaving pattern, a location of each sub-data stream segment in a plurality of sub-data stream segments obtained after a data stream is divided, to obtain a re-sorted data stream without changing a location of any bit data in each sub-data stream segment, so as to implement the segment interleaving.

A process in which the transmit end performs segment interleaving may include the following steps.

Step 1: Determine a location of each sub-data stream segment in the data stream obtained after the segment interleaving.

In this embodiment of this application, N segments of adjacent sub-data streams may be grouped into one group of sub-data streams, and segment interleaving is performed on the one group of sub-data streams. N is a positive integer that is greater than 1. In this case, a location of each sub-data stream segment in each group of sub-data streams obtained before the segment interleaving is first determined, and then a location of each sub-data stream segment in each group of sub-data streams on which segment interleaving is performed is determined.

Certainly, in step 1, the data stream obtained after the FEC coding may not be divided into a plurality of groups of sub-data streams, instead, all to-be-sent sub-data streams are grouped into one group, and segment interleaving is performed on all the sub-data streams.

In step 1, a location of each sub-data stream segment in one group of sub-data streams on which segment interleaving is performed may be determined according to a segment interleaving pattern. The segment interleaving pattern may include a location of each sub-data stream segment obtained after the segment interleaving, and the location is corresponding to a location of each sub-data stream segment obtained before the segment interleaving. For example, the segment interleaving pattern may be shown in Table 1. In Table 1, in one group of sub-data streams that includes N segments of sub-data streams, a sub-data stream at location 1 before the segment interleaving is corresponding to a sub-data stream at location N after the segment interleaving; a sub-data stream at location 2 before the segment interleaving is corresponding to a sub-data stream at location N−1 after the segment interleaving; . . . ; a sub-data stream at location N before the segment interleaving is corresponding to a sub-data stream at location 1 after the segment interleaving.

TABLE 1

| Location before segment interleaving | Location after segment interleaving |
|---|---|
| 1 | N |
| 2 | N-1 |
| ... | ... |
| N | 1 |

The segment interleaving pattern may be agreed upon by a transmit end and a receive end in advance, or may be sent by the transmit end to the receive end before data is sent, and this is not limited in this embodiment of this application.

Step 2: Recombine each sub-data stream segment according to the location of each sub-data stream segment in the data stream obtained after the segment interleaving, and use a recombined data stream as the data stream obtained after the segment interleaving.

Specifically, for each group of sub-data streams, each sub-data stream segment in each group of sub-data streams is recombined according to a location obtained after the segment interleaving, and a recombined data stream is used as the data stream obtained after the segment interleaving.

Figure 6:
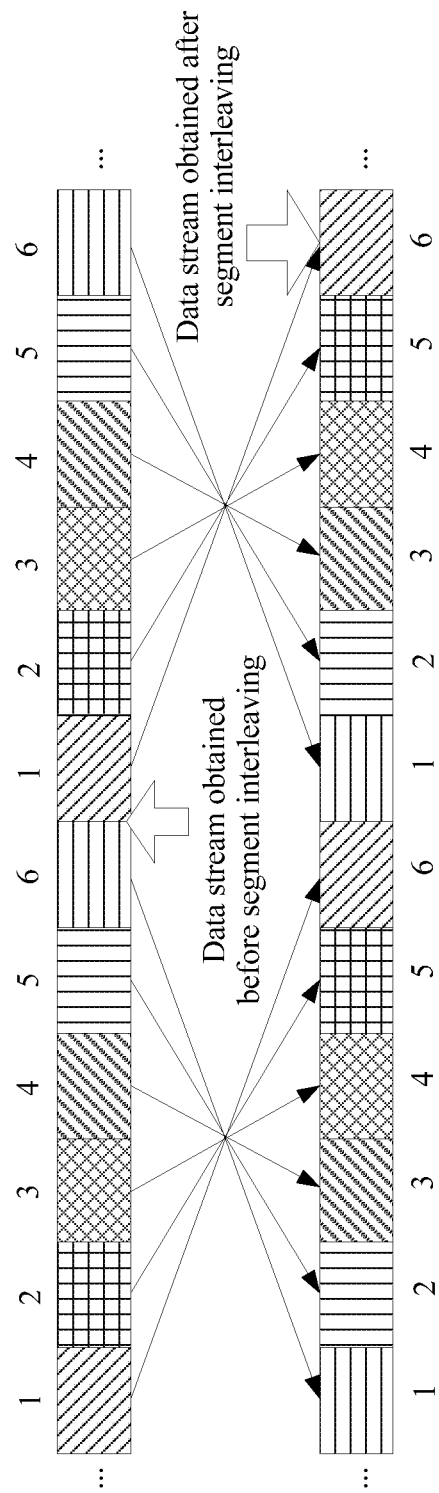
FIG. 6 is a schematic diagram of segment interleaving performed on a data stream obtained after FEC coding according to an embodiment of this application.

For example, FIG. 6 is a schematic diagram of segment interleaving performed on a data stream obtained after FEC coding in an embodiment of this application. In FIG. 6, each group of sub-data streams includes six sub-data stream segments. In each group of sub-data streams, a sub-data stream at location 1 before the segment interleaving corresponds to a sub-data stream at location 6 after the segment interleaving; a sub-data stream at location 2 before the segment interleaving corresponds to a sub-data stream at location 5 after the segment interleaving; . . . ; and a sub-data stream at location 6 before the segment interleaving corresponds to a sub-data stream at location 1 after the segment interleaving. The data stream obtained after the segment interleaving is obtained after each group of sub-data streams is recombined according to the foregoing correspondence. A sub-data stream at location 6 in each group of sub-data streams in the data stream obtained after interleaving is a sub-data stream at location 1 before interleaving, and a correspondence of a sub-data stream in another location can be obtained by analogy.

It should be noted that in a segment interleaving process, a location of each sub-data stream segment changes, but an order of data in each sub-data stream segment remains unchanged. Therefore, continuity during sending of data in each sub-data stream segment can be ensured.

In the foregoing solution, by means of segment interleaving, a plurality of segments of consecutive sub-data streams are kept when burst bit errors in a data stream are dispersed. As a result, the receive end may not need to interleave a received data stream again before performing FEC decoding on the data stream and after performing balancing processing on the data stream again. Therefore, interleaving and de-interleaving steps that need to be performed in a process that includes iteration balancing and decoding operations in the prior art can be avoided, so that a speed of balancing processing performed by the receive end on the received data stream can be improved.

Finally, the data stream obtained after the segment interleaving is sent. Operations such as adjustment and filtering may further be performed before the data stream is sent, and this may be specifically determined according to an actual situation, and details are not described herein.

After receiving the data stream sent by the transmit end, the receive end may perform operations such as demodulation, balancing, de-interleaving, FEC decoding, decision, and the like. Specifically, FIG. 7 is a schematic flowchart of data processing according to an embodiment of this application.

Figure 7:
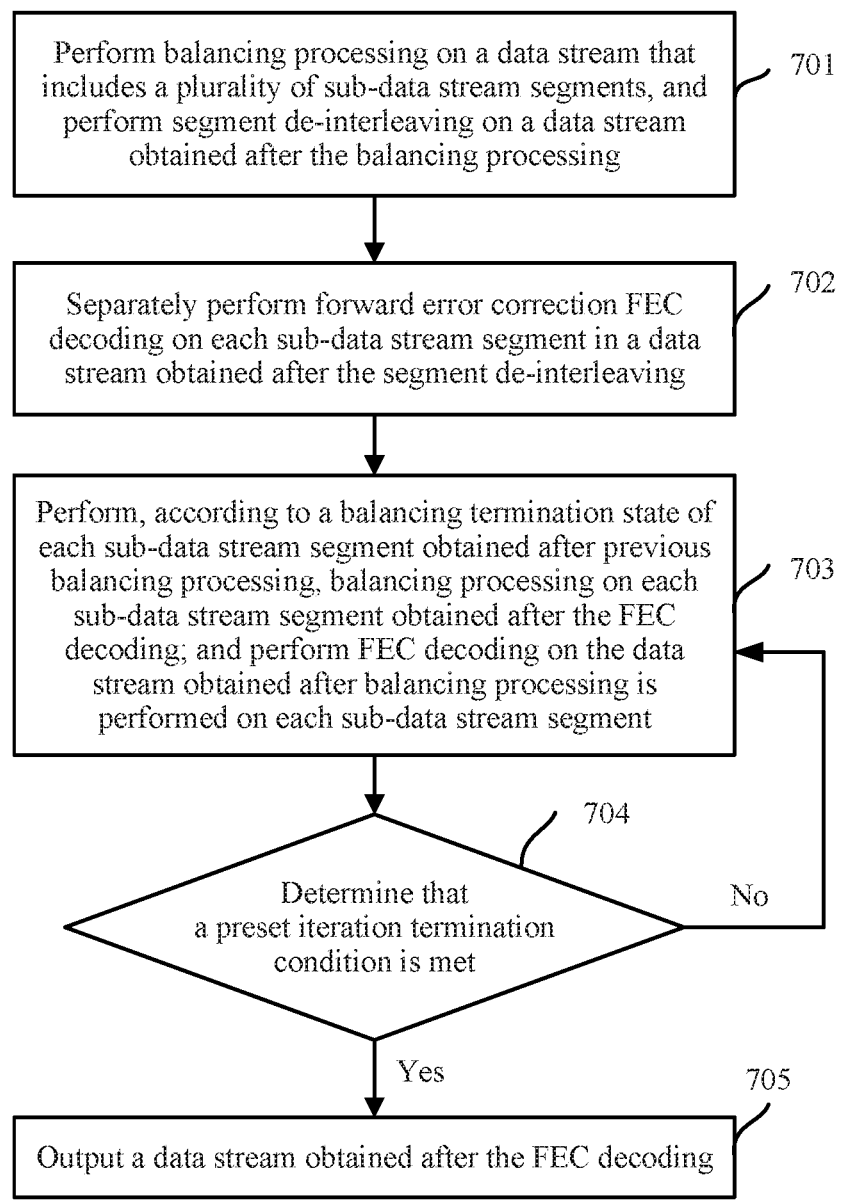
FIG. 7 is a schematic flowchart of data processing according to an embodiment of this application.

Referring to FIG. 7, the method specifically includes the following steps:

Step 701: Perform balancing processing on a data stream that includes a plurality of sub-data stream segments, and perform segment de-interleaving on a data stream obtained after the balancing processing.

Step 702: Separately perform forward error correction FEC decoding on each sub-data stream segment in a data stream obtained after the segment de-interleaving.

Step 703: Perform, according to a balancing termination state of each sub-data stream segment obtained after previous balancing processing, balancing processing on each sub-data stream segment obtained after the FEC decoding; and perform FEC decoding on the data stream obtained after balancing processing is performed on each sub-data stream segment.

Step 704: If it is determined that the preset iteration termination condition is met, output a data stream obtained after the FEC decoding in step 705; or if it is determined that the preset iteration termination condition is not met, return to step 703.

In step 701, after receiving the data stream sent by the transmit end, the receive end may determine, according to a rule used by the transmit end to divide the data stream into a plurality of sub-data stream segments, each sub-data stream segment included in the received data stream. Balancing processing may be performed, in a plurality of manners, on the received data stream that includes the plurality of sub-data stream segments. For example, balancing may be performed on the received data stream by using an MLSD (Maximum-likelihood Sequence Detection) algorithm.

For example, when balancing is performed on the received data stream by using the MLSD algorithm, a process in which a data stream is transferred over a channel may be seen as a status transition process. A data stream at any moment is corresponding to one status of channel transmission. Transmission of a data stream over a channel causes transition of a channel status. Interference in a transmission process causes an error to the transition of the channel status. A status transition error occurred in channel transmission can be corrected by using the MLSD algorithm, so as to recover correct data stream. When balancing is performed on the received data stream by using the MLSD algorithm, a balancing termination state of each sub-data stream segment that is in the data stream and that is obtained after the balancing processing is recorded. The balancing termination state of each sub-data stream segment obtained after the balancing processing is used as a balancing initial status before next balancing processing, so as to enhance performance of balancing processing.

In this embodiment of this application, the segment de-interleaving includes: re-sorting each sub-data stream segment in the data stream that includes the plurality of sub-data stream segments according to a location of each sub-data stream segment obtained before the segment interleaving, so as to obtain the data stream on which segment de-interleaving is performed. An order of data in each sub-data stream segment in the data stream on which segment de-interleaving is performed remains unchanged.

In this embodiment of this application, a process in which segment de-interleaving is performed on the data stream on which balancing processing is performed is an inverse processing that is corresponding to a segment interleaving process performed by a transmit end. Specifically, the segment de-interleaving may include the following steps.

Step 1: Determine a location of each sub-data stream segment in the data stream obtained after the balancing processing in a data stream obtained after the segment de-interleaving.

Specifically, in step 1, if the transmit end divides the data stream into a plurality of groups of data streams, and each group of data streams includes a plurality of sub-data stream segments for segment interleaving, the receive end may first determine each group of sub-data streams obtained by means of division when the transmit end performs segment interleaving, and then determine a location of each sub-data stream segment that is in each group of sub-data streams and on which segment de-interleaving is performed.

For example, when sending a data stream, the transmit end divides the data stream into 12 sub-data stream segments, and groups every 6 consecutive segments of sub-data streams into one group to obtain two groups of sub-data streams, and then separately performs segment interleaving on each group of sub-data streams. After performing balancing processing on a received data stream, the receive end divides, according to a rule used by the transmit end to divide the data stream, a data stream obtained after the balancing processing into 12 sub-data stream segments, and determines two groups of sub-data streams. Each group of sub-data streams determined by the receive end is the same as each group of sub-data streams obtained by means of division performed by the transmit end. The receive end performs segment de-interleaving on each group of sub-data streams.

If the transmit end does not divide the data stream obtained after the FEC coding into a plurality of groups of sub-data streams, but groups all sub-data streams in the sent data stream into one group and performs segment interleaving on all the sub-data streams, correspondingly, after grouping, into one group, all sub-data streams in the data stream obtained after the balancing processing, the receive end determines a location of each sub-data stream segment obtained after the segment de-interleaving.

In this embodiment of this application, the location of each sub-data stream segment obtained after the segment de-interleaving may be determined by using a segment interleaving pattern. For specific content of the segment interleaving pattern, refer to description in step 401, and details are not described herein.

The segment interleaving pattern may be agreed upon by a transmit end and a receive end in advance, or may be sent by the transmit end to the receive end before a data stream is sent.

Step 2: Recombine each sub-data stream segment according to the location of each sub-data stream segment in the data stream obtained after the segment de-interleaving, and use a recombined data stream as the data stream obtained after the segment de-interleaving.

Specifically, if the transmit end divides the data stream into a plurality of groups of data streams, and each group of data streams includes a plurality of sub-data stream segments for segment interleaving, for each group of sub-data streams, the receive end may recombine each sub-data stream segment in each group of sub-data streams according to the location of each sub-data stream segment obtained after the segment de-interleaving, and a recombined data stream is used as the data stream obtained after the segment de-interleaving.

Figure 8:
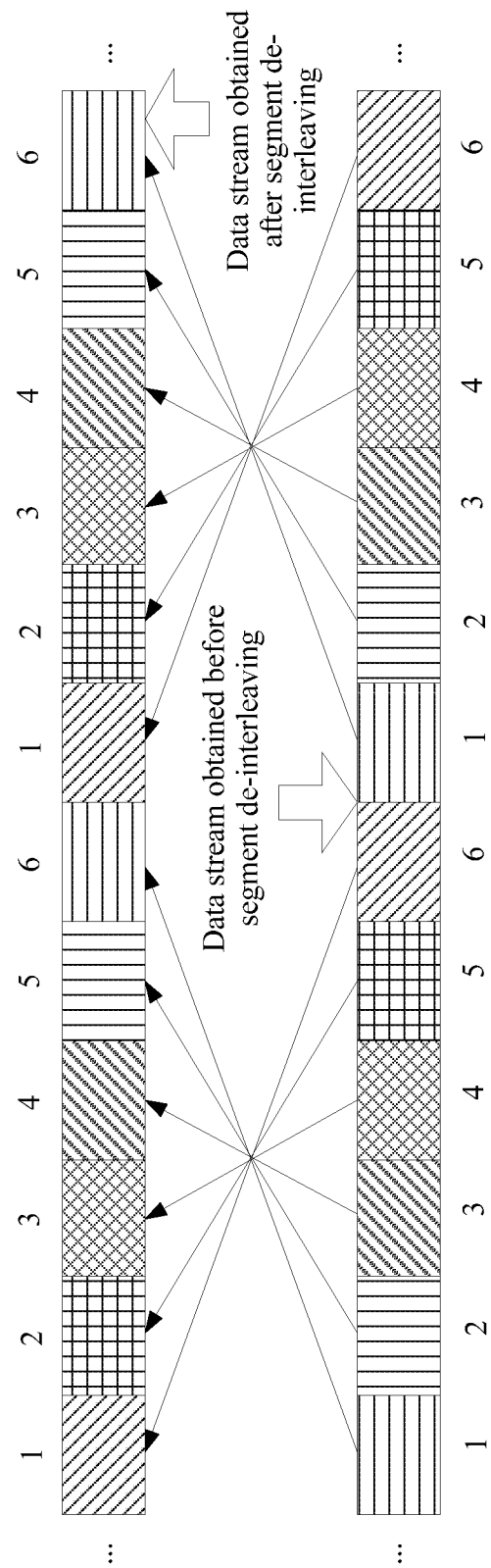
FIG. 8 is a schematic diagram of segment de-interleaving performed on a data stream obtained after FEC coding according to an embodiment of this application.

For example, FIG. 8 is a schematic diagram of segment de-interleaving performed on a data stream obtained after FEC coding in an embodiment of this application. In FIG. 8, each group of sub-data streams includes six sub-data stream segments. In each group of sub-data streams, a sub-data stream at location 1 before the segment de-interleaving corresponds to a sub-data stream at location 6 after the segment de-interleaving; a sub-data stream at location 2 before the segment de-interleaving corresponds to a sub-data stream at location 5 after the segment de-interleaving; . . . ; and a sub-data stream at location 6 before the segment de-interleaving corresponds to a sub-data stream at location 1 after the segment de-interleaving. The data stream obtained after the segment de-interleaving is obtained after each group of sub-data streams is recombined according to the foregoing correspondence. A sub-data stream at location 6 in each group of sub-data streams in the data stream obtained after the segment de-interleaving is a sub-data stream at location 1 before interleaving, and a correspondence of a sub-data stream in another location can be obtained by analogy.

If the transmit end does not divide the data stream obtained after the FEC coding into a plurality of groups of sub-data streams, but groups all sub-data streams in the sent data stream into one group and performs segment interleaving on all the sub-data streams, correspondingly, the receive end may recombine, according to locations of all sub-data streams in a data stream that are obtained after segment de-interleaving, all the sub-data streams obtained after balancing processing, and use a recombined data stream as the data stream obtained after the segment de-interleaving.

It should be noted that in a segment de-interleaving process, a location of each sub-data stream segment changes, but an order of data in each sub-data stream segment remains unchanged. Therefore, continuity during sending of data in each sub-data stream segment can be ensured.

In step 702, there may be a plurality of implementations in which FEC decoding is performed on the data stream obtained after the segment de-interleaving. For example, decoding may be performed by using an LDPC decoding algorithm, or decoding may be performed by using a Turbo decoding algorithm, provided that an algorithm for performing FEC decoding can be corresponding to an algorithm for performing FEC coding by the transmit end.

Figure 9:
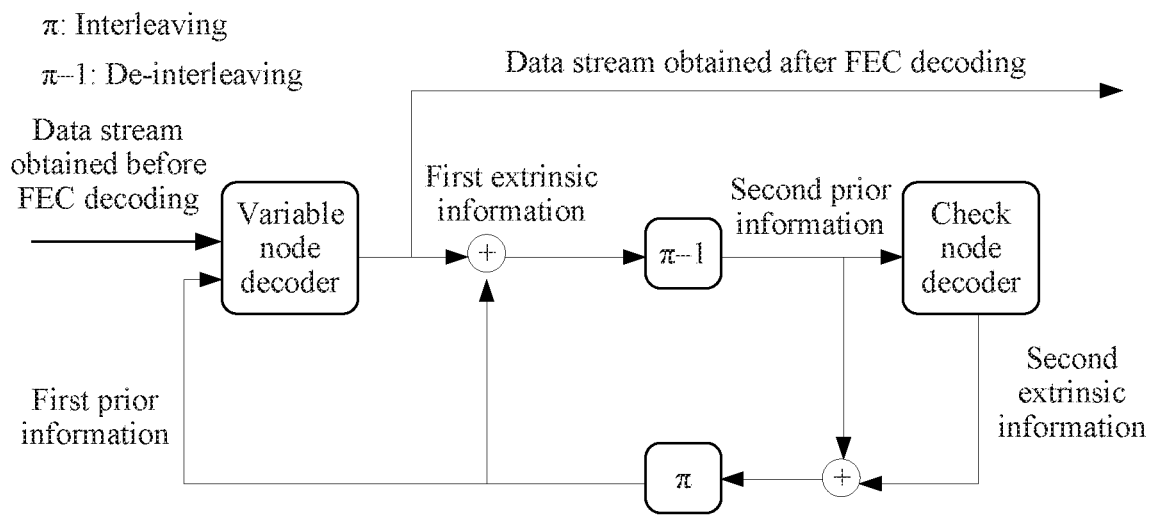
FIG. 9 is a schematic flowchart of FEC decoding according to an embodiment of this application.

For example, FIG. 9 is a schematic flowchart of FEC decoding according to an embodiment of this application. In FIG. 9, FEC decoding that is to be performed on a data stream is implemented after the data stream passes through a variable node decoder (VND), undergoes interleaving, passes through a check node decoder (CND), undergoes de-interleaving, and the like. Specifically, referring to FIG. 9, the VND calculates first extrinsic information by using an LDPC decoding algorithm and according to an input data stream and first prior information, and then the VND outputs the first extrinsic information. De-interleaving is performed on the first extrinsic information, and the first extrinsic information on which de-interleaving is performed is used as second prior information of the CND. The CND calculates second extrinsic information according to the second prior information. Interleaving is performed on the second extrinsic information, and the second extrinsic information on which interleaving is performed is used as the first prior information of the VND. The foregoing process is repeated until a correct decoding output is obtained. It should be noted that each of the first prior information, the first extrinsic information, the second prior information, and the second extrinsic information is in a form of a log-likelihood ratio.

In step 703, segment balancing needs to be further performed on the data stream obtained after the FEC decoding, and the segment balancing is to perform balancing on each sub-data stream segment. A balancing algorithm used for performing segment balancing is not limited in this embodiment of this application. For example, an MLSD algorithm may be used to perform balancing on each sub-data stream segment.

In addition, when balancing is being performed on each sub-data stream segment, a balancing termination state of each sub-data stream segment obtained after previous balancing processing is used as a balancing initial status for this balancing, so as to obtain better balancing performance and reduce a bit error rate.

In this embodiment of this application, parallel segment balancing may be simultaneously performed on a plurality of sub-data stream segments, or segment balancing may be performed on only one sub-data stream segment each time.

When segment balancing is performed on only one sub-data stream segment each time, each sub-data stream segment obtained after the FEC decoding is first obtained, and then balancing processing is performed on each sub-data stream segment according to an order of a location of each sub-data stream segment in the data stream obtained after the FEC decoding and the balancing termination state of each sub-data stream segment obtained after the previous balancing processing.

When parallel segment balancing is simultaneously performed on a plurality of sub-data stream segments, each sub-data stream segment obtained after the FEC decoding is first obtained, and parallel balancing processing is performed according to the balancing termination state of each sub-data stream segment obtained after the previous balancing processing. When the parallel balancing processing is being performed, a plurality of sub-data stream segments may be simultaneously balanced each time. Finally, each sub-data stream segment obtained after the parallel balancing processing is recombined into a data stream according to a location of each sub-data stream segment in the data stream obtained before the parallel balancing processing, and the recombined data stream is output.

After balancing processing is performed on each sub-data stream segment, FEC decoding processing needs to be further performed on each sub-data stream segment obtained after the balancing. A specific decoding algorithm used is not limited in this embodiment of this application, provided that the algorithm is corresponding to a coding algorithm used for the FEC coding.

In this embodiment of this application, step 703 may be performed for a plurality of times according to an actual situation, so as to reduce a system bit error rate and improve a system capacity.

In step 704, there may be a plurality of preset iteration termination conditions. One possible preset iteration termination condition is as follows: A quantity of times for which FEC decoding is separately performed on each sub-data stream segment is equal to a threshold, or a quantity of times for which balancing processing is performed on each sub-data stream segment is equal to a threshold. The threshold may be set according to an actual situation.

For example, in this embodiment of the present invention, if it is determined that a quantity of times for which FEC decoding is separately performed on each sub-data stream segment is equal to a threshold or that a quantity of times for which balancing processing is performed on each sub-data stream segment is equal to the threshold, it is determined that the preset iteration termination condition is met, and a data stream obtained after last FEC decoding is output; or if it is determined that the preset iteration termination condition is not met, return to step 703 to continue to perform segment balancing processing and FEC decoding on each sub-data stream segment.

Another possible preset iteration termination condition is as follows: A Cyclic Redundancy Check (CRC) check performed on a data streams obtained after last FEC decoding succeeds.

For example, in this embodiment of the present invention, if it is determined that the CRC check performed on the data stream obtained after the last FEC decoding succeeds, it is determined that the preset iteration termination condition is met, and the data stream obtained after the last FEC decoding is output; or if it is determined that the preset iteration termination condition is not met, return to step 703 to continue to perform segment balancing processing and FEC decoding on each sub-data stream segment.

To describe this embodiment of this application more clearly, the following uses a specific embodiment to describe the method provided in this embodiment of this application.

Figure 10:
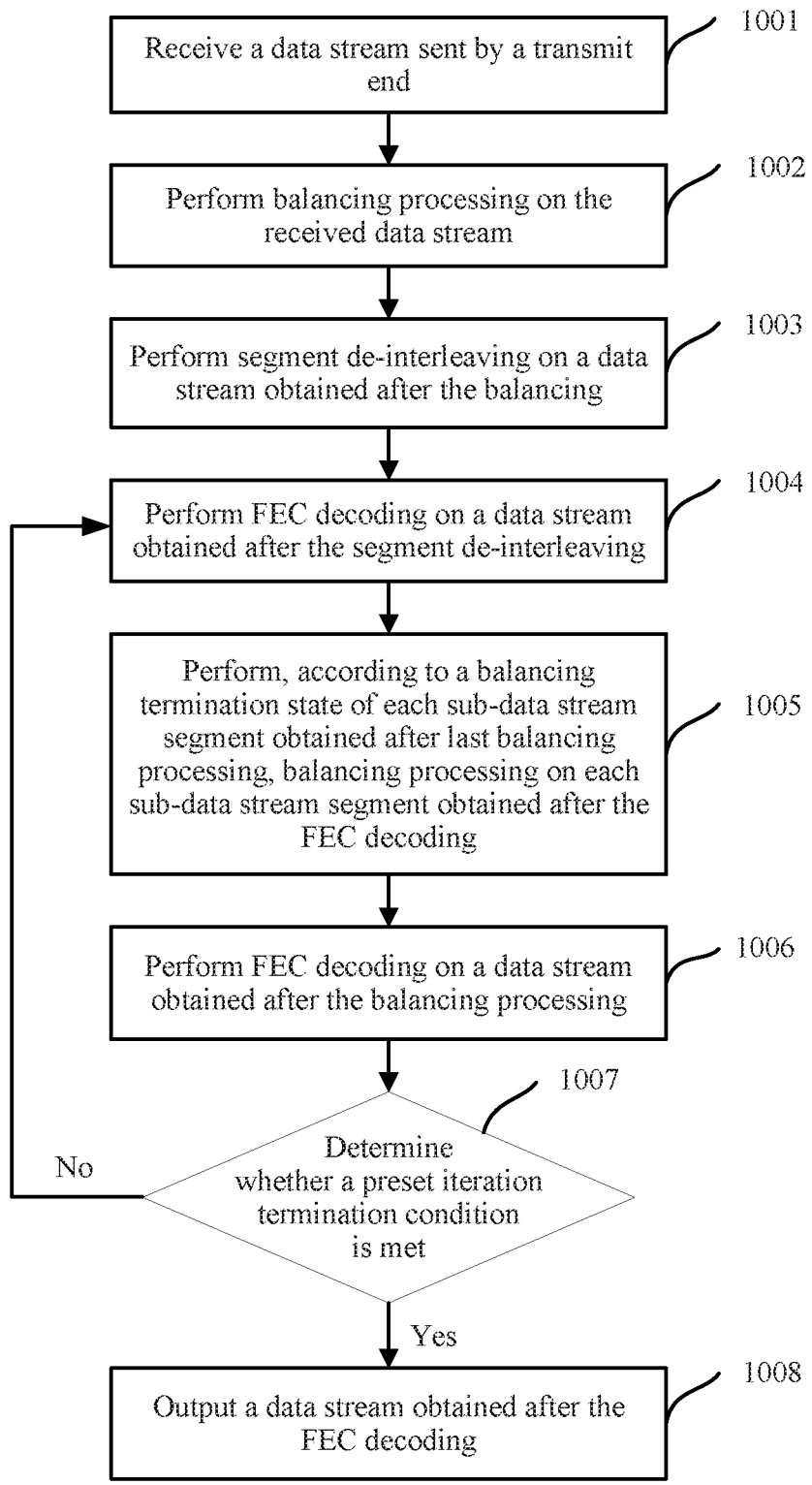
FIG. 10 is a schematic flowchart of data stream processing according to an embodiment of this application.

As shown in FIG. 10, FIG. 10 is a schematic flowchart of data stream processing according to an embodiment of this application. Steps in FIG. 10 includes:

Step 1001: Receive a data stream sent by a transmit end.

Step 1002: Perform balancing processing on the received data stream.

Balancing processing may be performed on the data stream by using an MLSD algorithm.

When balancing processing is performed on the data stream, a balancing termination state of each sub-data stream segment in a data stream obtained after balancing processing needs to be further recorded.

Step 1003: Perform segment de-interleaving on a data stream obtained after the balancing.

After the segment de-interleaving, a segment of consecutive burst bit errors in a data stream is dispersed into a plurality of small segments of burst bit errors, and the plurality of small segments of burst bit errors are distributed in a larger range.

Step 1004: Perform FEC decoding on a data stream obtained after the segment de-interleaving.

An algorithm used for performing FEC decoding is not limited, provided that the algorithm is corresponding to an FEC coding algorithm used by the transmit end.

Step 1005: Perform, according to a balancing termination state of each sub-data stream segment obtained after last balancing processing, balancing processing on each sub-data stream segment obtained after the FEC decoding.

Segment balancing may be simultaneously performed on a plurality of sub-data stream segments, or segment balancing may be performed on only one sub-data stream segment each time.

Step 1006: Perform FEC decoding again on each sub-data stream segment obtained after the balancing processing.

Likewise, an algorithm used for performing FEC decoding is not limited, provided that the algorithm is corresponding to an FEC coding algorithm.

Step 1007: Determine whether a preset iteration termination condition is met, and perform step 1008 if the preset iteration termination condition is met, or perform step 1004 if the preset iteration termination condition is not met.

The preset iteration termination condition may be as follows: A quantity of times for which FEC decoding is separately performed on each sub-data stream segment is equal to a threshold, or a quantity of times for which balancing processing is performed on each sub-data stream segment is equal to a threshold.

Alternatively, the preset iteration termination condition may be as follows: A CRC check performed on a data streams obtained after last FEC decoding succeeds.

Step 1008: Output a data stream obtained after the FEC decoding.

For the foregoing method process, an embodiment of this application further provides a data processing apparatus. For specific content of the apparatus, refer to the foregoing method embodiment, and details are not described herein.

Figure 11:
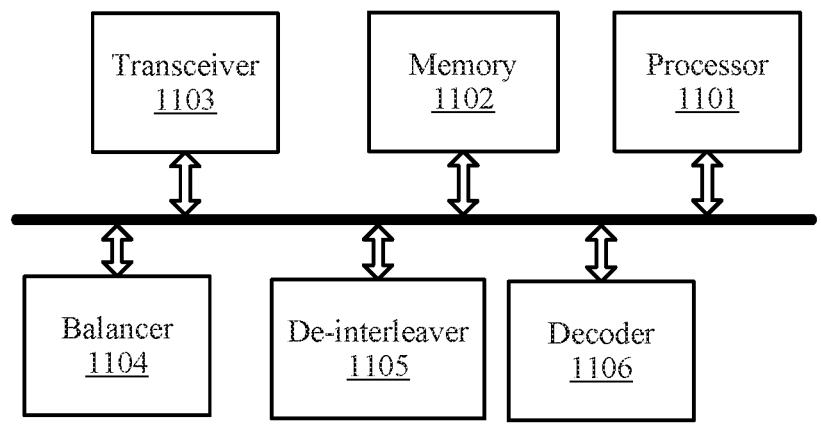
FIG. 11 is a schematic structural diagram of a data stream processing apparatus according to an embodiment of this application.

As shown in FIG. 11, an embodiment of this application provides a schematic structural diagram of a data processing apparatus.

The apparatus may be configured to perform the method shown in FIG. 7.

Referring to FIG. 11, the apparatus may include: a processor 1101, a memory 1102, a transceiver 1103, a balancer 1104, a de-interleaver 1105, a decoder 1106, and the like.

The processor 1101 may be a central processing unit (CPU), a network processor (NP), or a combination of a CPU and an NP. The processor 1101 may further include a hardware chip. The foregoing hardware chip may be an application-specific integrated circuit (ASIC), a programmable logic device (PLD), or a combination thereof. The foregoing PLD may be a complex programmable logic device (CPLD), a field-programmable gate array (FPGA), generic array logic (GAL), or any combination thereof. The memory 1102 may include a volatile memory, for example, a random access memory (RAM); the memory 1102 may also include a non-volatile memory, for example, a read-only memory (ROM), a flash memory, a hard disk drive (HDD), or a solid-state drive (SSD); and the memory 1102 may further include a combination of the foregoing types of memories. The transceiver 1103 may be a wired transceiver, a wireless transceiver, or a combination thereof. The wired transceiver may be, for example, an Ethernet interface. The Ethernet interface may be an optical interface, an electrical interface, or a combination thereof. The wireless transceiver may be, for example, a wireless local area network transceiver, a cellular network transceiver, or a combination thereof.

The memory 1102 is configured to store a received data stream.

The de-interleaver 1105 is configured to perform balancing processing on a data stream that includes a plurality of sub-data stream segments, and perform segment de-interleaving on a data stream obtained after the balancing processing.

The decoder 1106 is configured to separately perform forward error correction FEC decoding on each sub-data stream segment in a data stream obtained after the segment de-interleaving.

The balancer 1104 is configured to perform, according to a balancing termination state of each sub-data stream segment obtained after previous balancing processing, balancing processing on each sub-data stream segment obtained after the FEC decoding; and perform, by using the decoder 1106, FEC decoding on the data stream obtained after balancing processing is performed on each sub-data stream segment.

The processor 1101 is configured to: if it is determined that a preset iteration termination condition is met, output the data stream obtained after the FEC decoding; or if it is determined that a preset iteration termination condition is not met, return to a step of the performing, according to a balancing termination state of each sub-data stream segment obtained after previous balancing processing, balancing processing on each sub-data stream segment obtained after the FEC decoding.

Optionally, the de-interleaver 1105 is specifically configured to determine a location of each sub-data stream segment in the data stream obtained after the balancing processing in a data stream obtained after the segment de-interleaving. The de-interleaver 1105 is further configured to recombine each sub-data stream segment according to the location of each sub-data stream segment in the data stream obtained after the segment de-interleaving, and use a recombined data stream as the data stream obtained after the segment de-interleaving, where an order of data in each sub-data stream segment remains unchanged.

Optionally, the processor 1101 is configured to if it is determined that a quantity of times for which FEC decoding is separately performed on each sub-data stream segment is equal to a threshold or that a quantity of times for which balancing processing is performed on each sub-data stream segment is equal to the threshold, determine that the preset iteration termination condition is met. The processor 1101 may be configured to if it is determined that a cyclic redundancy check CRC check performed on the data stream obtained after the FEC decoding succeeds, determine that the preset iteration termination condition is met.

Optionally, the balancer 1104 is specifically configured to obtain each sub-data stream segment obtained after the FEC decoding, and perform balancing processing on each sub-data stream segment according to an order of a location of each sub-data stream segment in the data stream obtained after the FEC decoding and the balancing termination state of each sub-data stream segment obtained after the previous balancing processing. The balancer 1104 may be configured to obtain each sub-data stream segment obtained after the FEC decoding, perform parallel balancing processing according to the balancing termination state of each sub-data stream segment obtained after the previous balancing processing, recombine each sub-data stream segment obtained after the parallel balancing processing into a data stream according to a location of each sub-data stream segment in the data stream obtained before the parallel balancing processing, and output the data stream.

Figure 12:
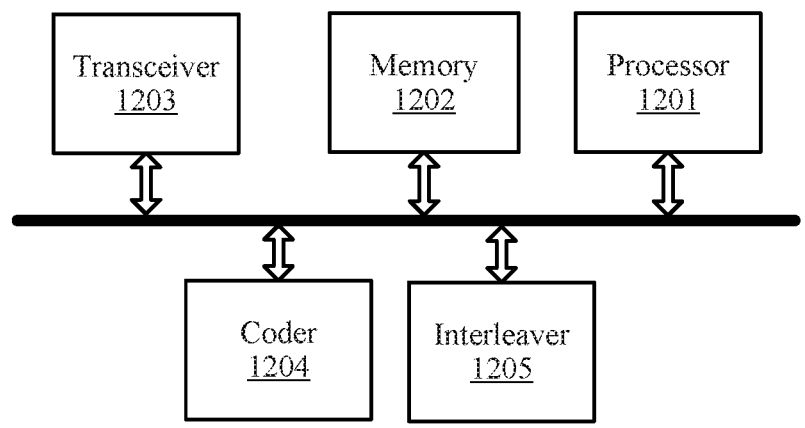
FIG. 12 is a schematic structural diagram of a data stream processing apparatus according to an embodiment of this application.

As shown in FIG. 12, an embodiment of this application provides a schematic structural diagram of a data processing apparatus.

The apparatus may be configured to perform the method shown in FIG. 4.

Referring to FIG. 12, the apparatus may include: a processor 1201, a memory 1202, a transceiver 1203, a coder 1204, an interleaver 1205, and the like.

The processor 1201 may be a CPU, an NP, or a combination of a CPU and an NP. The processor 1201 may further include a hardware chip. The foregoing hardware chip may be an application-specific integrated circuit ASIC, a PLD, or a combination thereof. The PLD may be a CPLD, an FPGA, a GAL, or any combination thereof. The memory 1202 may include a volatile memory, for example, a RAM. The memory 1202 may also include a non-volatile memory, for example, a ROM, a flash memory, an HDD, or an SSD. The memory 1202 may further include a combination of the foregoing types of memories. The transceiver 1203 may be a wired transceiver, a wireless transceiver, or a combination thereof. The wired transceiver may be, for example, an Ethernet interface. The Ethernet interface may be an optical interface, an electrical interface, or a combination thereof. The wireless transceiver may be, for example, a wireless local area network transceiver, a cellular network transceiver, or a combination thereof.

The memory 1202 is configured to store an obtained data stream.

The transceiver 1203 is configured to obtain a data stream.

The coder 1204 is configured to perform forward error correction FEC coding on the data stream.

The processor 1201 is configured to obtain, by segmenting a data stream obtained after the FEC coding, a data stream that includes a plurality of sub-data stream segments.

The interleaver 1205 is configured to perform segment interleaving on the data stream that includes the plurality of sub-data stream segments, and send, by using the transceiver 1203, a data stream obtained after the segment interleaving, where the segment interleaving includes re-sorting a location of each sub-data stream segment in the data stream that includes the plurality of sub-data stream segments, and an order of data in each sub-data stream segment in the data stream obtained after the segment interleaving remains unchanged.

Optionally, the interleaver 1205 is specifically configured to determine a location of each sub-data stream segment in the data stream obtained after the segment interleaving. The interleaver 1205 is configured to recombine each sub-data stream segment according to the location of each sub-data stream segment in the data stream obtained after the segment interleaving, and use a recombined data stream as the data stream obtained after the segment interleaving.

A person skilled in the art should understand that the embodiments of this application may be provided as a method, a system, or a computer program product. Therefore, this application may use a form of hardware only embodiments, software only embodiments, or embodiments with a combination of software and hardware. In addition, this application may use a form of a computer program product that is implemented on one or more computer-usable storage media (including but not limited to a disk memory, an optical memory, and the like) that include computer-usable program code.

This application is described with reference to the flowcharts and/or block diagrams of the method, the device (system), and the computer program product according to the embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

A person skilled in the art can make various modifications and variations to this application without departing from the spirit and scope of this application. This application is intended to cover these modifications and variations of this application, provided that they fall within the scope of protection defined by the following claims and their equivalent technologies.

What is claimed is:
1. A method, comprising:
  performing, by a device, channel balancing on a data stream comprising a plurality of sub-data stream segments;
  after channel balancing the data stream, performing, by the device, segment de-interleaving on the data stream;
  after segment de-interleaving the data stream, separately performing, by the device, forward error correction (FEC) decoding on each of the sub-data stream segments in the data stream;
  after separately performing FEC decoding on each of the sub-data stream segments, iteratively performing, by the device, channel balancing and FEC decoding on the data stream until a preset iteration termination condi- tion is met, wherein iteratively performing channel balancing and FEC decoding on the data stream comprises:
    performing, according to a balancing termination state of each of the plurality of sub-data stream segments, channel balancing on each of the plurality of sub-data stream segments, wherein the balancing termination state of each of the plurality of sub-data stream segments was obtained from previously performing channel balancing on the data stream prior to a current iteration of performing channel balancing on the data stream; and
    outputting, by the device, the data stream obtained from iteratively performing channel balancing and FEC decoding on the data stream when the preset iteration termination condition is met.

2. The method according to claim 1, further comprising:
    determining a location of each of the plurality of sub-data stream segments in the data stream after segment de-interleaving the data stream; and
    recombining each of the plurality of sub-data stream segments according to the location of each of the plurality of sub-data stream segments in the data stream to provide a recombined data stream, wherein the recombined data stream is used as the data stream for separately performing FEC decoding on each of the sub-data stream segments in the data stream, and wherein an order of data in each of the plurality of sub-data stream segments remains unchanged after recombining each of the plurality of sub-data stream segments.

3. The method according to claim 1, wherein the preset iteration termination condition is met when a quantity of times that FEC decoding is separately performed on each of the plurality of sub-data stream segments is equal to a threshold.

4. The method according to claim 1, wherein the preset iteration termination condition is met when a quantity of times that channel balancing is performed on each of the plurality of sub-data stream segments is equal to a threshold.

5. The method according to claim 1, wherein the preset iteration termination condition is met when after performing FEC decoding on the data stream during an iteration, a cyclic redundancy check (CRC) check performed on the data stream succeeds.

6. The method according to claim 1, wherein performing, according to the balancing termination state of each of the plurality of sub-data stream segments, channel balancing on each of the plurality of sub-data stream segments comprises performing, according to an order of a location of each sub-data stream segment in the data stream obtained after FEC decoding the data stream, channel balancing on each of the plurality of sub-data stream segments in the data stream.

7. The method according to claim 1, wherein performing, according to the balancing termination state of each of the plurality of sub-data stream segments, channel balancing on each of the plurality of sub-data stream segments comprises:
    performing parallel channel balancing on each of the plurality of sub-data stream segments according to the balancing termination state of each of the plurality of sub-data stream segments; and
    recombining each of the plurality of sub-data stream segments into the data stream after performing parallel channel balancing on each of the plurality of sub-data stream segments according to a location of each of the plurality of sub-data stream segments in the data stream before performing parallel balancing processing on each of the plurality of sub-data stream segments; and
    outputting the data stream.

8. An apparatus, comprising:
    a processor; and
    a non-transitory computer-readable storage medium storing a program to be executed by the processor, the program including instructions for:
        performing channel balancing on a data stream comprising a plurality of sub-data stream segments;
        after channel balancing the data stream, performing segment de-interleaving on the data stream;
        after segment de-interleaving the data stream, separately performing forward error correction (FEC) decoding on each of the sub-data stream segments in the data stream;
        after separately performing FEC decoding on each of the sub-data stream segments, iteratively performing channel balancing and FEC decoding on the data stream until a preset iteration termination condition is met, wherein iteratively performing channel balancing and FEC decoding on the data stream comprises:
            performing, according to a balancing termination state of each of the plurality of sub-data stream segments, channel balancing on each of the plurality of sub-data stream segments, wherein the balancing termination state of each of the plurality of sub-data stream segments was obtained from previously performing channel balancing on the data stream prior to a current iteration of performing channel balancing on the data stream; and
        outputting, the data stream obtained from iteratively performing channel balancing and FEC decoding on the data stream when the preset iteration termination condition is met.

9. The apparatus according to claim 8, wherein instructions comprise further instructions for:
    determining a location of each of the plurality of sub-data stream segments in the data stream after segment de-interleaving the data stream; and
    recombining each of the plurality of sub-data stream segments according to the location of each of the plurality of sub-data stream segments in the data stream to provide a recombined data stream, wherein the recombined data stream is used as the data stream for separately performing FEC decoding on each of the sub-data stream segments in the data stream, and wherein an order of data in each of the plurality of sub-data stream segments remains unchanged after recombining each of the plurality of sub-data stream segments.

10. The apparatus according to claim 8, the preset iteration termination condition is met when:
    a quantity of times that FEC decoding is separately performed on each of the plurality of sub-data stream segments is equal to a threshold;
    a quantity of times that channel balancing is performed on each of the plurality of sub-data stream segments is equal to a threshold; or
    a cyclic redundancy check (CRC) check performed on the data stream succeeds.

11. The apparatus according to claim 8, wherein the instructions for performing, according to the balancing termination state of each of the plurality of sub-data stream segments, channel balancing on each of the plurality of sub-data stream segments comprise further instructions for performing, according to an order of a location of each sub-data stream segment in the data stream obtained after FEC decoding the data stream, channel balancing on each of the plurality of sub-data stream segments in the data stream.

12. The apparatus according to claim 8, wherein the instructions for performing, according to the balancing termination state of each of the plurality of sub-data stream segments, channel balancing on each of the plurality of sub-data stream segments comprise further instructions for:
  performing parallel channel balancing on each of the plurality of sub-data stream segments according to the balancing termination state of each of the plurality of sub-data stream segments; and
  recombining each of the plurality of sub-data stream segments into the data stream after performing parallel channel balancing on each of the plurality of sub-data stream segments according to a location of each of the plurality of sub-data stream segments in the data stream before performing parallel balancing processing on each of the plurality of sub-data stream segments; and
outputting the data stream.

* * * * *